(12) United States Patent
Pandita et al.

(10) Patent No.: US 9,577,646 B1
(45) Date of Patent: Feb. 21, 2017

(54) FRACTIONAL PHASE LOCKED LOOP (PLL) ARCHITECTURE

(71) Applicant: QUALCOMM Incorporated, San Diego, CA (US)

(72) Inventors: Bupesh Pandita, Raleigh, NC (US); Hanan Cohen, San Diego, CA (US); Eskinder Hailu, Cary, NC (US); Kenneth Luis Arcudia, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/820,894

(22) Filed: Aug. 7, 2015

(51) Int. Cl.
 *H03K 21/10* (2006.01)

(52) U.S. Cl.
 CPC .................................... *H03K 21/10* (2013.01)

(58) Field of Classification Search
 CPC ...... H03K 21/00; H03K 21/023; H03K 23/00; H03K 23/40; H03K 27/00; H03K 29/00; H03K 7/06
 USPC .................................. 327/113, 115, 117, 119
 See application file for complete search history.

(56) References Cited

U.S. PATENT DOCUMENTS

| 7,092,479 | B1 | 8/2006 | Reid et al. |
| 7,289,592 | B2 * | 10/2007 | Lee ...................... H03K 23/505 |
| | | | 327/115 |
| 8,565,368 | B1 | 10/2013 | Chen et al. |
| 8,599,997 | B2 | 12/2013 | Chen et al. |
| 8,891,725 | B2 | 11/2014 | Terrovitis |
| 2012/0194220 | A1 | 8/2012 | Cavin |
| 2014/0312936 | A1 | 10/2014 | Abdel-Haleem et al. |

OTHER PUBLICATIONS

Shirisha B., et al., "Phase Noise Repression in Fractional-N PLLs using Glitch-Free Phase Switching Multi-Modulus Frequency Divider," International Journal of New Trends in Electronics and Communication (IJNTEC), Nov. 2013, vol. 1 (4), pp. 10-21.
Vaucher C.S., et al., "A Family of Low-Power Truly Modular Programmable Dividers in Standard 0.35-pm CMOS Technology", IEEE Journal of Solid-state Circuits, Jul. 2000, vol. 35, No. 7, pp. 1039-1045.
International Search Report and Written Opinion—PCT/US2016/041380—ISA/EPO—Oct. 18, 2016.

* cited by examiner

*Primary Examiner* — John Poos
(74) *Attorney, Agent, or Firm* — Loza & Loza LLP (57) ABSTRACT

In one embodiment, method for frequency division comprises propagating a modulus signal up a chain of cascaded divider stages from a last one of the divider stages to a first one of the divider stages, and, for each of the divider stages, generating a respective local load signal when the modulus signal propagates out of the divider stage. The method also comprises, for each of the divider stages, inputting one or more respective control bits to the divider stage based on the respective local load signal, the one or more respective control bits setting a divider value of the divider stage.

24 Claims, 9 Drawing Sheets

FRACTIONAL PHASE LOCKED LOOP (PLL) ARCHITECTURE

BACKGROUND

Field

Aspects of the present disclosure relate generally to frequency synthesis, and more particularly, to phase locked loops (PLLs).

Background

A phase locked loop (PLL) may be used in frequency synthesis to generate a signal having a desired frequency by multiplying the frequency of a reference signal by a corresponding amount. PLLs are widely used to provide signals having desired frequencies in wireless communication systems, micro-processing systems, and high-speed data systems.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a frequency divider is provided. The frequency divider comprises a plurality of cascaded divider stages forming a divider chain, wherein each of the divider stages is configured to receive one or more respective control bits and to set a divider value of the divider stage based on the one or more respective control bits, and wherein the plurality of cascaded divider stages is configured to propagate a modulus signal up the divider chain from a last one of the divider stages to a first one of the divider stages, and each of the divider stages is configured to output a respective local load signal when the modulus signal propagates out of the divider stage. The frequency divider also comprises an extension device coupled to the plurality of divider stages, wherein, for each of the divider stages, the extension device is configured to receive the respective local load signal from the divider stage and to input the one or more respective control bits for the divider stage to the divider stage based on the respective local load signal.

A second aspect relates to a frequency divider. The frequency divider comprises a plurality of cascaded divider stages forming a divider chain, wherein the plurality of cascaded divider stages is configured to receive a plurality of control bits that set a divisor of the plurality of cascaded divider stages, to divide a frequency of an input signal by the divisor, and to propagate a modulus signal up the divider chain from a last one of the divider stages to a first one of the divider stages. The frequency divider also comprises an output latch configured to receive the modulus signal from a modulus output of one of the divider stages, to receive the input signal, and to retime the received modulus signal with the received input signal to generate an output signal of the frequency divider.

A third aspect relates to a method for frequency division. The method comprises propagating a modulus signal up a chain of cascaded divider stages from a last one of the divider stages to a first one of the divider stages. The method also comprises, for each of the divider stages, generating a respective local load signal when the modulus signal propagates out of the divider stage. The method further comprises, for each of the divider stages, inputting one or more respective control bits to the divider stage based on the respective local load signal, the one or more respective control bits setting a divider value of the divider stage.

A fourth aspect relates to an apparatus for frequency division. The apparatus comprises means for propagating a modulus signal up a chain of cascaded divider stages from a last one of the divider stages to a first one of the divider stages. The apparatus also comprises, for each of the divider stages, means for generating a respective local load signal when the modulus signal propagates out of the divider stage. The apparatus further comprises, for each of the divider stages, means for inputting one or more respective control bits to the divider stage based on the respective local load signal, the one or more respective control bits setting a divider value of the divider stage.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
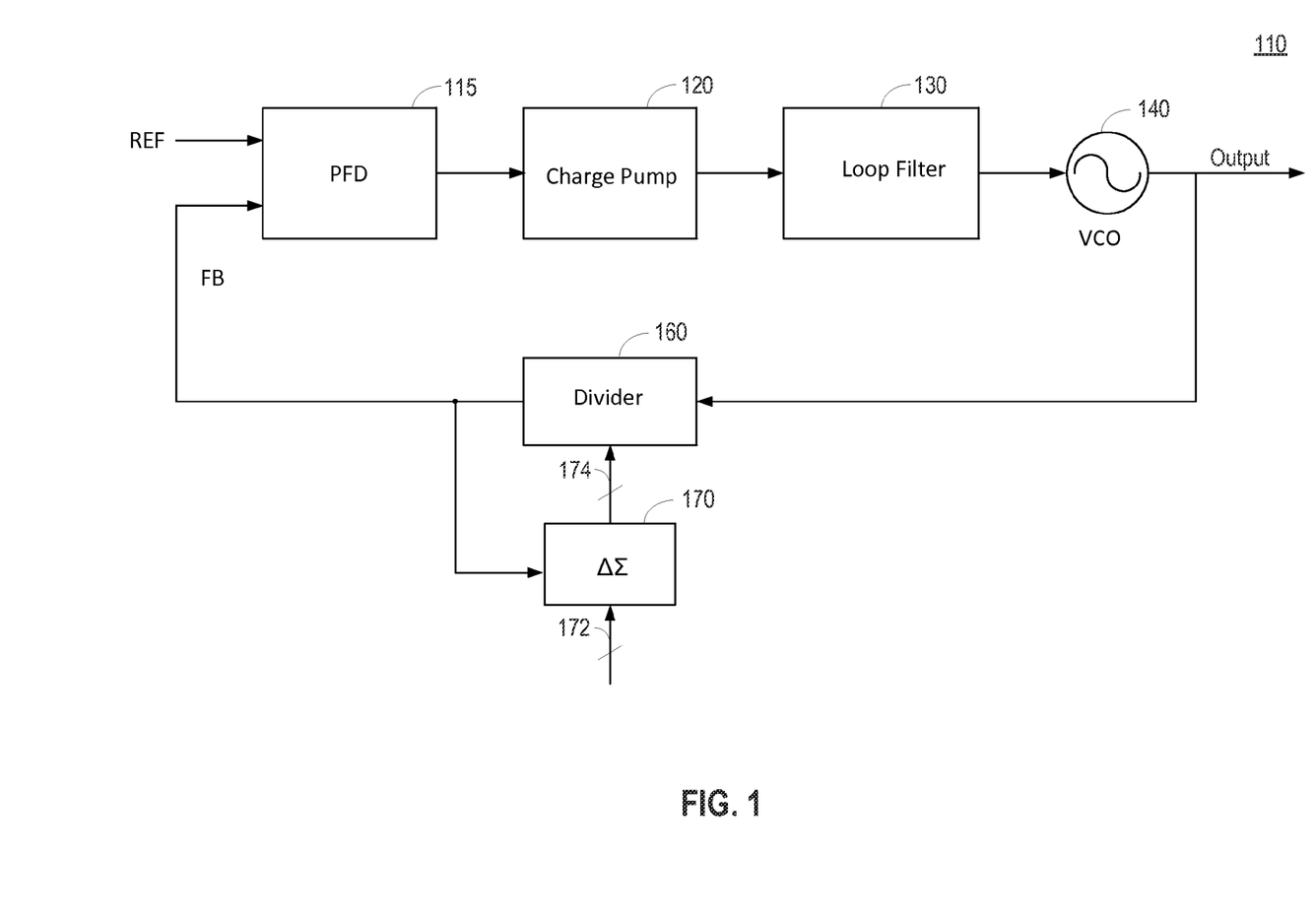
FIG. 1 shows an example of a phase locked loop (PLL).

FIG. 1 shows an example of a phase locked loop (PLL) 110. The PLL 110 comprises a phase-frequency detector (PFD) 115, a charge pump 120, a loop filter 130, a voltage-controlled oscillator (VCO) 140, and a feedback frequency divider 160. The output of the VCO 140 provides the output signal for the PLL 110, in which the frequency of the output signal is controlled by adjusting an input voltage to the VCO 140, as discussed further below. The output signal is fed back to the PFD detector 115 through the frequency divider 160. The frequency divider 160 divides the frequency of the output signal by a divisor N to produce a feedback signal (denoted "FB") having a frequency equal to $f_{out}/N$, where $f_{out}$ is the frequency of the output signal. The divisor may also be referred to as the divider value or division ratio.

The PFD detector 115 receives as inputs the feedback signal FB and a reference signal (denoted "REF"). The reference signal REF may come from a crystal oscillator or another source with a stable frequency. The PFD detector 115 detects the phase difference between the reference signal REF and the feedback signal FB, and outputs the detected phase difference (error) to the charge pump 120. The charge pump 120 and the loop filter 130 convert the detected phase difference into a control voltage that controls the frequency of the VCO 140. The control voltage adjusts the frequency of the VCO 140 in a direction that reduces the phase difference between the reference signal REF and the feedback signal FB. When the PLL 110 is locked, the output signal has a frequency approximately equal to N times the frequency of the reference signal REF.

In a wireless communication system, it may be desirable to change the output frequency of the PLL 110. The output frequency may be changed by adjusting the divisor of the frequency divider 160. In one example, the divisor may be adjusted to any one of a plurality of different integer values. However, in order to adjust the output frequency of the PLL with fine granularity (high resolution), the frequency divider 160 may need to adjust the divisor to a fractional value (i.e., a value with a fractional component). This can be achieved by toggling (switching) the divisor between two integer values such that the time-average value of the divisor is approximately equal to a desired fractional value.

In this regard, the divisor of the frequency divider 160 may be controlled by the output of a delta-sigma modulator 170, as shown in FIG. 1. The delta-sigma modulator 170 outputs a plurality of control bits 174 to the divider 160 that set the divisor of the divider 160. In operation, the delta-sigma modulator 170 receives a desired fractional value 172 for the divisor. The delta-sigma modulator 170 dynamically changes the control bits 174 to the divider 160 according to the desired fractional value 172 such that the time-average value of the divisor is approximately equal to the desired fractional value. In certain aspects, the delta-sigma modulator 170 may be clocked using the feedback signal FB output by the frequency divider 160, in which case the delta-sigma modulator 170 may update the control bits 174 once per cycle of the feedback signal FB. The PLL 110 in FIG. 1 may be referred to as a fractional-N frequency synthesizer or another terminology.

Figure 2:
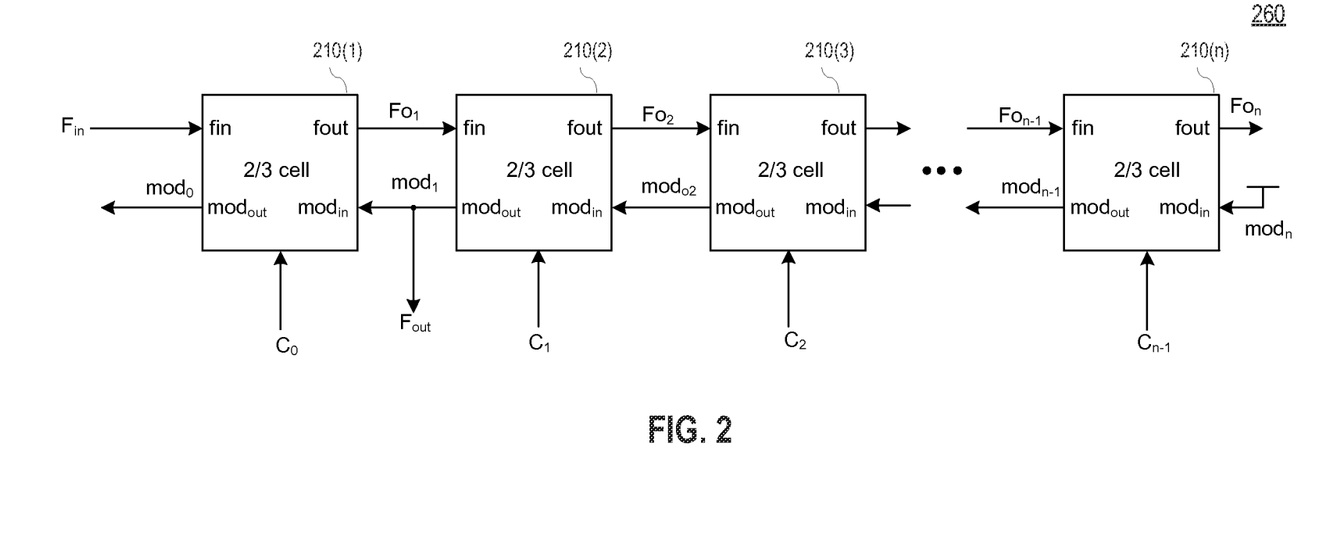
FIG. 2 shows an example of a multi-modulus frequency divider.

The divider 160 may be implemented using cascaded divider stages (also referred to as divider cells). In this regard, FIG. 2 shows an example of a multi-modulus frequency divider 260 comprising a chain of cascaded 2/3 divider stages 210(1) to 210(n) (divider cells). Each 2/3 divider stage 210(1) to 210(n) has a frequency input (denoted "fin"), a frequency output (denoted "fout"), a modulus input (denoted "$mod_{in}$"), and a modulus output (denoted "$mod_{out}$"). The frequency input fin of the first divider stage 210(1) is coupled to the input of the divider 260, which may receive the output signal of the VCO 140. The frequency input fin of each of the other divider stages 210(2) to 210(n) is coupled to the frequency output fout of the previous divider stage in the chain. The modulus input "$mod_{in}$" of the last divider stage 210(n) may be held high (at logic one). The modulus input "$mod_{in}$" of each of the other divider stages 210(1) to 210(n-1) is coupled to the modulus output "$mod_{out}$" of the next divider stage in the chain, as shown in FIG. 2. This is because the modulus signal propagates up the chain of divider stages, as discussed further below.

In operation, each divider stage 210(1) to 210(n) receives a respective one of the control bits $C_0$ to $C_{n-1}$ from the delta-sigma modulator 170 (shown in FIG. 1). Each divider stage 210(1) to 210(n) divides the frequency of the signal at its frequency input fin by two or three depending on the logic states of the respective control bit and the respective input modulus signal. For example, each divider stage may divide the respective input frequency by three when both the respective control bit and respective input modulus signal are high, and divide the respective input frequency by two otherwise. Each of divider stages 210(1) to 210(n-1) outputs the respective frequency-divided signal to the next divider stage in the chain. Thus, the frequency of the signal input to the divider 260 is divided down by each divider stage as the signal propagates down the chain. The output signal $FO_n$ of the last divider stage 210(n) has a frequency equal to the frequency of the input signal divided by the divisor of the divider 260, which is set by the control bits $C_0$ to $C_{n-1}$.

The last divider stage 210(n) outputs a modulus signal comprising one pulse during one division cycle (e.g., one cycle of the output $FO_n$ of the last divider stage 210(n)). The modulus signal propagates up the chain of divider stages to the first divider stage 210(1). As the modulus signal propagates up the chain, the pulse width of the modulus signal (and hence the time that the modulus is high) may be reduced at each divider stage. In addition, the modulus signal may be re-clocked (retimed) at each divider stage by the signal at the frequency input fin of the divider stage.

In the example in FIG. 2, the modulus signal output by the second divider stage 210(2) is used for the output of the frequency divider 260, and therefore provides the feedback signal FB to the PFD 115 (shown in FIG. 1). The modulus signal can be used for the divider output because the modulus signal comprises one pulse per division cycle (e.g., one cycle of the output $FO_n$ of the last divider stage 210(n)). The divider output signal may also be input to the delta-sigma modulator 170 to clock the delta-sigma modulator 170, as discussed above.

A drawback of the frequency divider 260 in FIG. 2 is that the divisor of the divider 260 is constrained to a value between 2' to $2^{(n+1)}-1$, where n is the number of 2/3 divider stages (divider cells). This range may not be wide enough for many wireless applications. The divider 260 fails if the divisor crosses one of the $2^n$ to $2^{(n+1)}-1$ boundaries.

The division range of the divider may be extended by inserting combinational logic in the modulus signal path. The combinational logic may extend the division range, for example, by effectively bypassing one or more divider stages. The combinational logic may work well when the divisor is static. However, the combinational logic may fail when the divisor is dynamically changing, and therefore may not be suitable for use in a fractional synthesizer.

Another drawback of the frequency divider 260 is that the modulus signal accumulates jitter as the modulus signal propagates up the chain of the divider. The accumulated jitter appears at the output $F_{out}$ of the frequency divider 260, thereby introducing noise in the feedback path of the PLL.

Figure 3:
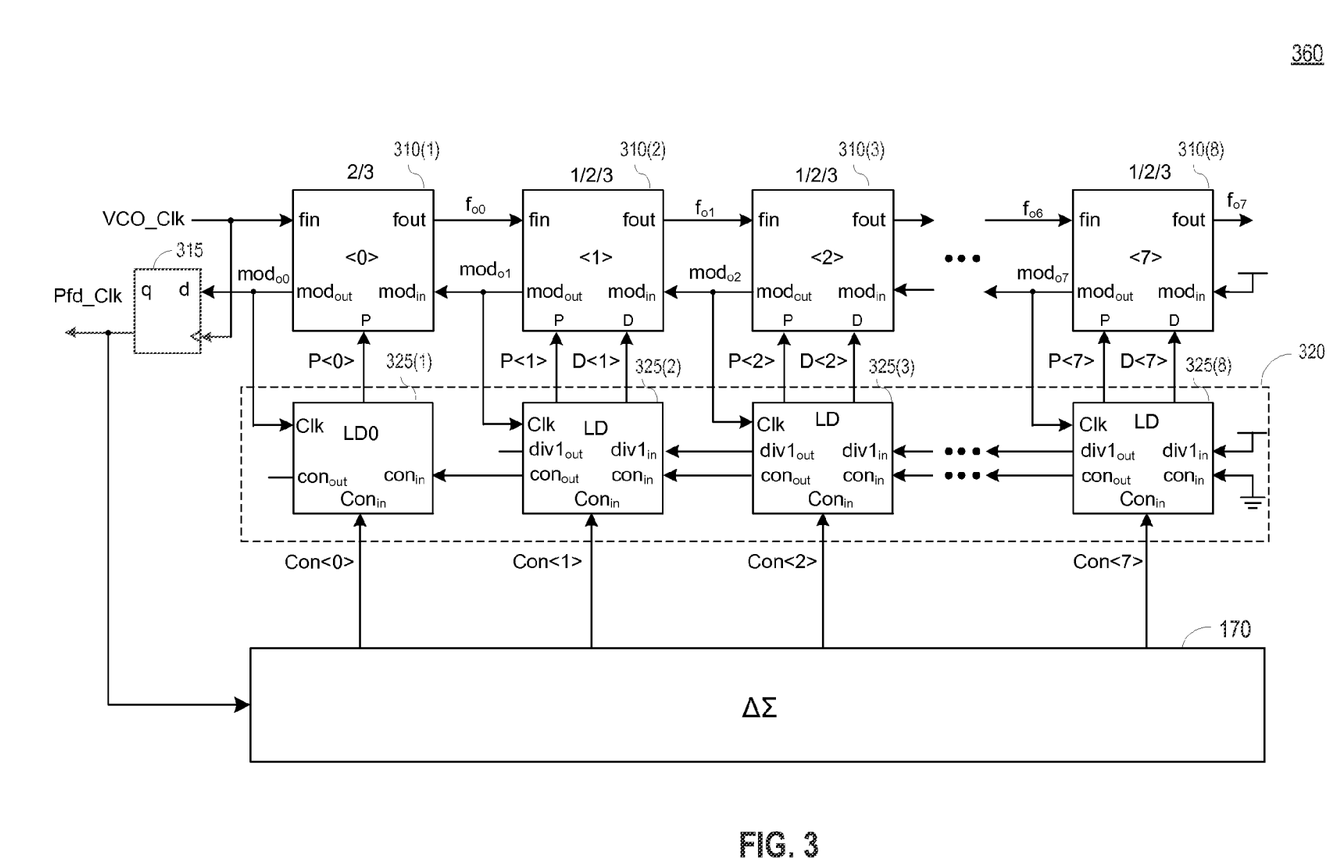
FIG. 3 shows an exemplary multi-modulus frequency divider according to certain aspects of the present disclosure.

FIG. 3 shows a multi-modulus frequency divider 360 according to certain aspects of the present disclosure. The frequency divider 360 comprises a chain of cascaded divider stages 310(1) to 310(8) (divider cells), an output latch 315, and a range extension device 320 configured to convert control bits Con<0> to Con<7> from the delta-sigma modulator 170 into program bits P<0> to P<7> and divide bits D<1> to D<7>, as discussed further below. Each divider stage 310(1) to 310(8) has a frequency input (denoted "fin"), a frequency output (denoted "fout"), a modulus input (denoted "$mod_{in}$"), and a modulus output (denoted "$mod_{out}$"). The frequency input fin of the first divider stage 310(1) is coupled to the input of the divider 360, which may receive the output signal of the VCO 140. The frequency input fin of each of the other divider stages 310(2) to 310(8) is coupled to the frequency output fout of the previous divider stage in the chain. The modulus input "$mod_{in}$" of the last divider stage 310(8) may be held high (at logic one), as shown in FIG. 3. The modulus input "$mod_{in}$" of each of the other divider stages 310(1) to 310(7) is coupled to the modulus output "$mod_{out}$" of the next divider stage in the chain, as shown in FIG. 3. This is because the modulus signal propagates up the chain of the divider stages, as discussed further below.

In the example shown in FIG. 3, the first divider stage 310(1) is a 2/3 divider stage configured to divide the frequency of the input signal (e.g., from the VCO) by two or three depending on the logic states of program bit P<0> and the respective input modulus signal. The first divider stage 310(1) outputs the resulting frequency-divided signal to the second divider stage 310(2). An exemplary implementation of the first divider stage 310(1) is discussed further below with reference to FIG. 4.

Each of the remaining divider stages 310(2) to 310(8) is a 1/2/3 divider stage configured to divide the frequency of the signal at its frequency input fin by one, two or three depending on the logic states of the respective program bit P and respective divide bit D. For example, each of the divider stages 310(2) to 310(8) may be configured to divide the respective input signal by one when the respective divide bit D is logic one. Also, each of the divider stages 310(2) to 310(8) may be configured to divide the respective input signal by two or three depending on the logic states of the respective program bit P and the respective input modulus signal when the respective divide bit D is logic zero. Each of divider stages 310(2) to 310(7) outputs the respective frequency-divided signal to the next divider stage in the chain. The output signal $f_{o7}$ of the last divider stage 310(8) has a frequency equal to the frequency of the input signal divided by the divisor of the divider 360, which is set by the program bits P<0> to P<7> and the divide bits D<1> to D<7>. An exemplary implementation of one of the divider stages 310(2) to 310(8) is discussed further below with reference to FIG. 6.

The last divider stage 310(8) outputs a modulus signal, which may comprise one pulse during one division cycle (e.g., one cycle of the output $f_{o7}$ of the last divider stage 310(8)). The modulus signal propagates up the chain of divider stages to the first divider stage 310(1). As the modulus signal propagates up the chain, the modulus signal may be re-clocked (retimed) at each divider stage by the signal at the frequency input fin of the divider stage.

In the example in FIG. 3, the modulus signal $mod_{o0}$ output by the first divider stage 310(1) is input to the output latch 315. The output latch 315 is clocked by the VCO signal (denoted "VCO_Clk") input to the divider 360, as shown in FIG. 3. The output latch 315 retimes the output modulus signal $mod_{o0}$ using the VCO signal, and outputs the retimed modulus signal as the output signal (denoted "Pfd_Clk") of the divider 360. Retiming the modulus signal with the VCO signal reduces jitter in the divider output signal Pfd_Clk, as discussed further below. The divider output signal Pfd_Clk may be used as the feedback signal FB to the PFD 115 (shown in FIG. 1). The divider output signal Pfd_Clk may also be input to the delta-sigma modulator 170 to clock the delta-sigma modulator 170, as shown in FIG. 3. In this case, the delta-sigma modulator 170 may update the control bits Con<0> to Con<7> once per cycle (period) of the divider output signal Pfd_Clk.

As discussed above, the range extension device 320 is configured to receive control bits Con<0> to Con<7> from the delta-sigma modulator 170, and convert the received control bits Con<0> to Con <7> into program bits P<0> to P<7> and divide bits D<1> to D<7> to set the divisor of the divider 360. In this regard, the program bits P<0> to P<7> and divide bits D<1> to D<7> may be considered control bits output by the extension device 320 to the divider stages 310(1) to 310(7) to set the divisor of the divider 360. The extension device 320 increases the division range of the divider 360 by allowing the use of 1/2/3 divider stages (divider cells). This increases the lower boundary of the division range compared with the divider 260 in FIG. 2. Thus, the control bits Con<0> to Con<7> are not constrained to a range between $2^n$ to $2^{(n+1)}-1$, as is the case for the divider 260 in FIG. 2.

The extension device 320 comprises a plurality of load devices 325(1) to 325(8) coupled in a load chain, where each load device corresponds to one of the divider stages 310(1) to 310(8). The first load device 325(1) has a main control input (denoted "$Con_{in}$") and a local control input (denoted "$con_{in}$"). Each of the other load devices 325(2) to 325(8) has a main control input (denoted "$Con_{in}$"), a local control input (denoted "$con_{in}$"), a local control output (denoted "$con_{out}$"), a local divide input (denoted "$div1_{in}$"), and a local divide output (denoted "$div1_{out}$"). The local control input $con_{in}$ of each of load devices 325(1) to 325(7) is coupled to the local control output $con_{out}$ of the next load device in the load chain. The local divide input $div1_{in}$ of each of load devices 325(2) to 325(7) is coupled to the local divide output $div1_{out}$ of the next load device in the load chain. The local control input $con_{in}$ of the last load device 325(8) is held low (e.g., tied to ground), and the local divide input $div1_{in}$ of the last load device 325(8) is held high (e.g., tied to a supply voltage). Each load device 325(1) to 325(8) is clocked by the modulus output of the respective divider stage 310(1) to 310(8), as discussed further below. Exemplary implementations of the load devices 325(1) to 325(8) are discussed further below with reference to FIGS. 8 and 9.

In operation, the last load device 325(8) receives control bit Con<7> from the delta-sigma modulator 170. The last load device 325(8) then generates program bit P<7> and divide bit D<7> based on the logic state of the received control bit Con<7>, the logic state of the respective local control input $con_{in}$ (which is low in this example), and the logic state of the respective local divide input $div1_{in}$ (which is high in this example). The last load device 325(8) may then input (load) the generated program bit P<7> and divide bit D<7> to the last divider stage 310(8) on an edge (e.g., rising edge) of the output modulus signal $\text{mod}_{o7}$ of the last divider stage 310(8). The last load device 325(8) may also generate a local control output bit and a local divide output bit based on the logic state of the received control bit Con<7>, the logic state of the respective local control input $\text{con}_{in}$, and the logic stage of the respective local divide input $\text{div1}_{in}$. The last load device 325(8) may then output the local control output bit and the local divide output bit to the previous load device 325(7) in the load chain via the respective local control output $\text{con}_{out}$ and respective local divide output $\text{div1}_{out}$, respectively.

Each of load devices 325(2) to 325(7) receives a respective control bit Con from the delta-sigma modulator 170, a local control input bit from the next load device in the loan chain, and a local divide input bit from the next load device in the load chain. Each load device generates a respective program bit P and a respective divide bit D based on the logic state of the respective control bit Con, the logic state of the respective local control input bit, and the logic state of the respective local divide input bit. Each load device may then input (load) the respective program bit P and divide bit D to the respective divider stage on an edge (e.g., rising edge) of the output modulus signal of the respective divider stage. Each load device may also generate a respective local control output bit and a respective local divide output bit based on the logic state of the respective control bit Con, the logic state of the respective local control input bit, and the logic state of the respective local divide input bit. Each load device may then output the respective local control output bit and the respective local divide output bit to the previous load device in the chain via the respective local control output $\text{con}_{out}$ and the respective local divide output $\text{div1}_{out}$, respectively. The respective local control output bit and the respective local divide output bit provide the local control input bit and the local divide input bit, respectively, for the previous load device in the chain.

The first load device 325(1) receives control bit Con<0> from the delta-sigma modulator 170, and a local control input bit from the second load device 325(2). The first load device 325(1) generates program bit P<0> based on the logic state of control bit Con<0>, and the logic state of the respective local control input bit. The first load device 325(1) may then input (load) the generated program bit P<0> to the first divider stage 310(1) on an edge (e.g., rising edge) of the output modulus signal $\text{mod}_{o0}$ of the first divider stage 310(1).

Thus, when the delta-sigma modulator 170 updates the control bits Con<0> to Con<7>, the load devices 325(1) to 325(8) internally generate the corresponding program bits P<0> to P<7> and divide bits D<1> to D<7> as the local control signal and local divide signal propagate up (ripple through) the chain of load devices. Each of load devices 325(2) to 325(8) inputs (loads) the corresponding program bit and divide bit to the respective divider stage on an edge (e.g., rising edge) of the output modulus signal of the respective divider stage. Thus, the output modulus signal of each divider stage acts as a local load signal that times the input (loading) of the respective program bit and respective divide bit to the divider stage.

The first load device 325(1) inputs (loads) program bit P<0> on an edge (e.g., rising edge) of the output modulus signal $\text{mod}_{o0}$ of the first divider stage 310(1). Thus, output modulus signal $\text{mod}_{o0}$ of the first divider stage 310(1) acts as a local load signal that times the input (loading) of program bit P<0> to the first divider stage 310(1).

Thus, when the delta-sigma modulator 170 updates the control bits Con<0> to Con<7>, the load devices 325(1) to 325(8) update the program bits P<0> to P<7> and divide bits D<1> to D<7> accordingly, as discussed above. The updated program bits program bits P<0> to P<7> and divide bits D<1> to D<7> are input (loaded) to the divider stages 310(1) to 310(8) as the modulus signal propagates up the chain of divider stages 310(1) to 310(8). More particularly, the program bit P and divide bit D for each of divider stages 310(2) to 310(8) is loaded to the divider stage on an edge (e.g., rising edge) of the respective output modulus signal, and the program bit P<0> for the first divider stage 310(1) is loaded on an edge (e.g., rising edge) of the output modulus signal $\text{mod}_{o0}$ of the first divider stage 310(1). As discussed further below with reference to FIG. 10, this prevents glitches at the output of the divider 360 when the divisor of the divider 360 is changed.

It is to be appreciated that the multi-modulus divider 360 is not limited to the exemplary implementation shown in FIG. 3. For instance, it is to be appreciated that the divider 360 is modular and may therefore be readily modified to comprise a different number of divider stages than shown in the example in FIG. 3 by reducing or increasing the number of cascaded divider stages. Further, although the divider 360 is discussed above in the context of a PLL, it is to be appreciated that the divider 360 is not limited to PLLs, and may be used in other applications requiring frequency division.

Figure 4:
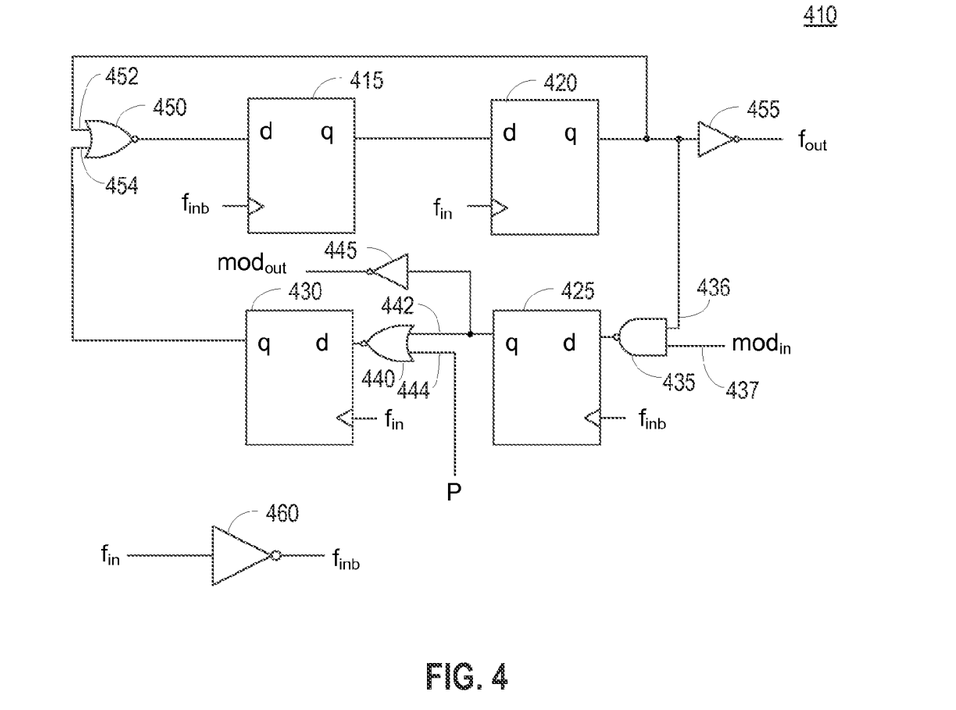
FIG. 4 shows an exemplary 2/3 divider stage according to certain aspects of the present disclosure.

FIG. 4 shows an exemplary implementation of a 2/3 divider stage 410 (divider cell) according to certain aspects of the present disclosure. The 2/3 divider stage 410 may be used to implement the first 2/3 divider stage 310(1) in FIG. 3. The 2/3 divider stage 410 comprises a first flip-flop 415, a second flip-flop 420, a third flip-flop 425, a fourth flip-flop 430, a NAND gate 435, a first NOR gate 440, a first inverter 445, a second NOR gate 450, and a second inverter 455.

The first and second flip-flops 415 and 420 are coupled in series, in which the output (denoted "q") of the second flip-flop 420 is coupled to a first input 452 of the second NOR gate 450 and the output of the second NOR gate 450 is coupled to the input (denoted "d") of the first flip-flop 415. The second inverter 455 is coupled between the output d of the second flip-flop 420 and the output (denoted "$f_{out}$") of the 2/3 divider stage 410. Thus, the inverse of the output q of the second flip-flop 420 provides the output signal of the 2/3 divider stage 410.

The output q of the second flip-flop 420 is also coupled to a first input 436 of the NAND gate 435. A second input 437 of the NAND gate 435 receives the input modulus signal (denoted "$\text{mod}_{in}$") for the 2/3 divider stage 410. For the example in which the 2/3 divider stage 410 is used to implement the first divider stage 310(1) in FIG. 3, the input modulus signal $\text{mod}_{in}$ is provided by the output modulus signal of the second divider stage 310(2) in the divider chain. The output of the NAND gate 435 is coupled to the input d of the third flip-flop 425. The first inverter 445 is coupled between the output q of the third flip-flop 425 and the modulus output (denoted "$\text{mod}_{out}$") of the 2/3 divider stage 410. Thus, the inverse of the output q of the third flip-flop 425 provides the modulus output of the 2/3 divider stage 410.

The output q of the third flip-flop 425 is coupled to a first input 442 of the first NOR gate 440. A second input 444 of the first NOR gate 440 receives a program bit (denoted "P") that programs the 2/3 divider stage to divide by two or three depending on the logic state (logic value) of the program bit P, as discussed further below. For the example in which the 2/3 divider stage 410 is used to implement the first divider stage 310(1) in FIG. 3, the program bit P corresponds to program bit P<0> in FIG. 3. The output of the first NOR gate 440 is coupled to the input d of the fourth flip-flop 430, and the output q of the fourth flip-flop 430 is coupled to a second input 454 of the second NOR gate 450.

The input signal (denoted "$f_{in}$") of the 2/3 divider stage 410 may be inverted by inverter 460 to generate an inverse of the input signal (denoted "$f_{inb}$"). The input signal $f_{in}$ and the inverted input signal $f_{inb}$ provide two complementary clock signals used to clock the flip-flops 415, 420, 425 and 430, as discussed further below. The first and third flip-flops 415 and 425 are clocked by the inverted input signal $f_{inb}$, and the second and fourth flip-flops 420 and 430 are clocked by the input signal $f_{in}$, as shown in FIG. 4. The flip-flops 415, 420, 425 and 430 may be positive-edge triggered flip-flops.

In operation, when the program bit P is logic one, the output of the first NOR gate 440 is logic zero regardless of the logic state at the first input 442 of the first NOR gate 440 (i.e., output of third-flip-flop 425). As a result, the output of the fourth flip-flop 430 to the second input 454 of the second NOR gate 450 is logic zero. This causes the second NOR gate 450 to act as an inverter between the output q of the second flip-flop 420 and the input d of the first flip-flop 415. As a result, the first and second flip-flops 415 and 420 are coupled in an oscillation loop that generates an output signal $f_{out}$ having a frequency equal to half the frequency of the input signal $f_{in}$. Thus, the 2/3 divider stage 410 divides the frequency of the input signal by two when the program bit P is logic one.

When the modulus $mod_{in}$ is logic zero, the output of the NAND gate 435 is logic one regardless of the logic state at the first input 436 of the NAND gate 435 (i.e., output q of second flip-flop 420). As a result, the third flip-flop 425 outputs a logic one to the first input 442 of the first NOR gate 440, causing the NOR gate 440 to output a logic zero to the fourth flip-flop 430 regardless of the logic state of the program bit P. This, in turn causes the fourth flip-flop 430 to output a logic zero to the second input 454 of the second NOR gate 450, causing the 2/3 divider stage 410 to divide the frequency of the input signal $f_{in}$ by two, as discussed above. Thus, the 2/3 divider stage 410 divides the frequency of the input signal by two when the modulus input $mod_{in}$ is logic zero regardless of the logic state of the program bit P.

When the modulus $mod_{in}$ is logic one and the program bit P is logic zero, the fourth flip-flip 430 outputs a logic one to the second input 454 of the second NOR gate 450 for a duration equal to, for example, one cycle (period) of the input signal $f_{in}$. This effectively increases the period at the output of the 2/3 divider stage 410 from two periods of the input signal $f_{in}$ to three periods of the input signal $f_{in}$, which is equivalent to dividing the frequency of the input signal $f_{in}$ by three. Thus, the 2/3 divider stage 410 divides by three when the program bit P is logic zero and the input modulus signal $mod_{in}$ is logic one.

Figure 5:
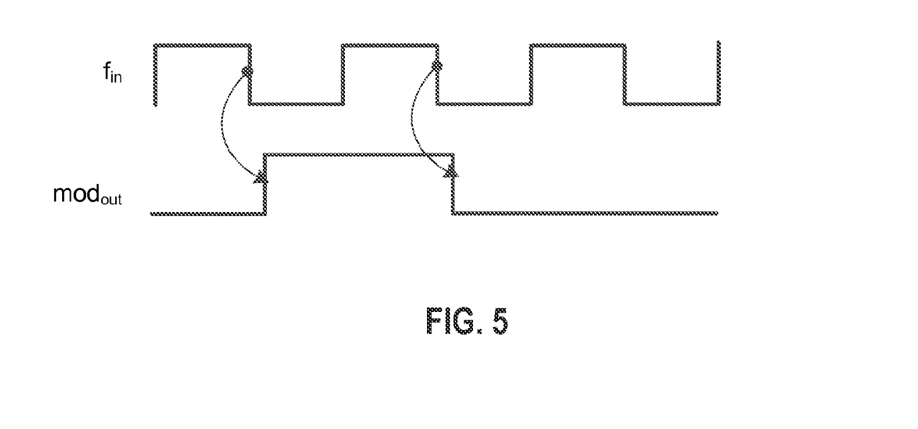
FIG. 5 is a timeline illustrating examples of an input signal and an output modulus signal for the 2/3 divider stage in FIG. 4.

In operation, the third flip-flip 425 (which is clocked by the inverted input signal $f_{inb}$) retimes the input modulus signal $mod_{in}$ with the inverted input signal $f_{inb}$ so that a positive edge of the output modulus signal $mod_{out}$ is approximately aligned with a negative edge of the input signal $f_{in}$. An example of this is shown in FIG. 5, which shows a timeline of the output modulus signal $mod_{out}$ and the input signal $f_{in}$. As shown in FIG. 5, the positive (rising) edge of the output modulus signal $mod_{out}$ is approximately aligned with a negative (falling) edge of the input signal $f_{in}$. There is a short delay between the positive edge of the output modulus signal $mod_{out}$ and the negative edge of the input signal $f_{in}$ due to propagation delays in the third flip-flop 425 and inverter 445. Also, the output modulus signal $mod_{out}$ may be high (logic one) for a duration approximately equal to one cycle (period) of the input signal $f_{in}$, as shown in FIG. 5. For the example in which the 2/3 divider stage 410 is used to implement the first divider stage 310(1) in FIG. 3, the output modulus signal $mod_{out}$ may be used to provide the output signal of the divider 360, as discussed above.

It is to be appreciated that the 2/3 divider stage 310(1) is not limited to the exemplary implementation shown in FIG. 4. For example, the 2/3 divider stage may be configured to divide the frequency of the input signal by two when the program bit P is logic zero instead of logic one. In this example, the 2/3 divider stage may divide the frequency by three when the program bit P and the input modulus signal $mod_{in}$ are both logic one.

Figure 6:
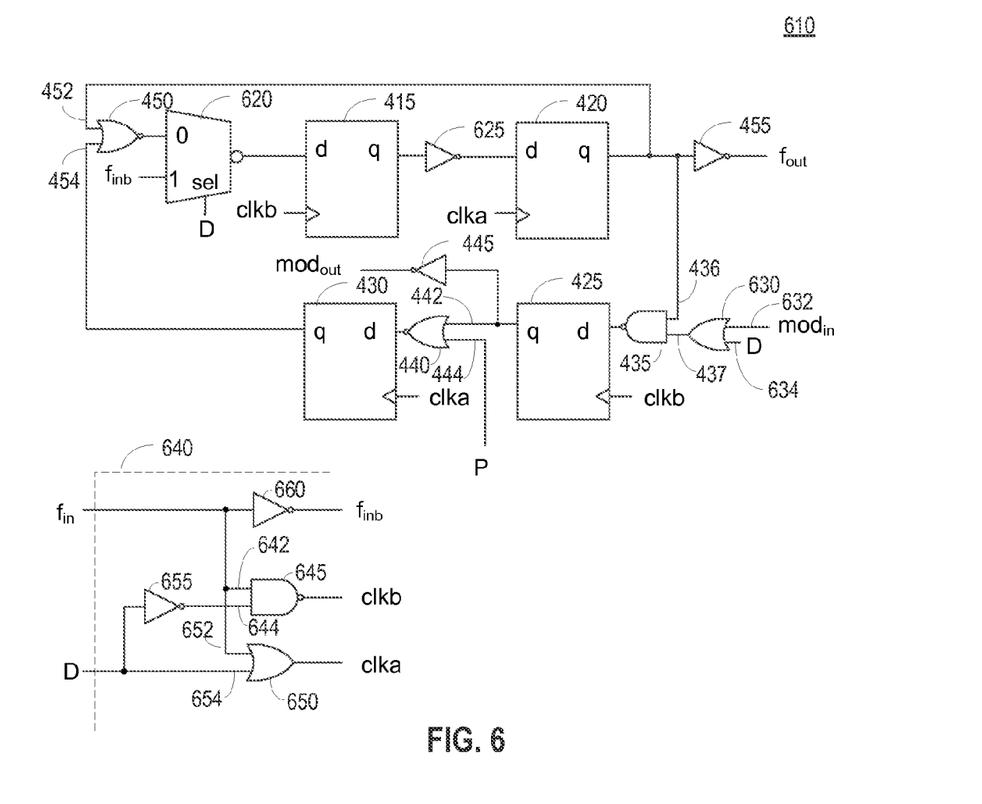
FIG. 6 shows an exemplary 1/2/3 divider stage according to certain aspects of the present disclosure.

FIG. 6 shows an exemplary implementation of a 1/2/3 divider stage 610 (divider cell) according to certain aspects of the present disclosure. The 1/2/3 divider stage 610 may be used to implement any one of divider stages 310(2) to 310(8) in FIG. 3. The 1/2/3 divider stage 610 is similar to the 2/3 divider stage 410 in FIG. 4, and further comprises an inverting multiplexer 620 between the output of the second NOR gate 450 and the input d of the first flip-flop 415, a third inverter 625 between the output q of the first flip-flop 415 and the input q of the second flip-flop 420, and a first OR gate 630. A first input 632 of the OR gate 630 receives the input modulus signal $mod_{in}$, a second input 634 of the OR gate 630 receives a divide bit D, and the output of the first OR gate 630 is coupled to the second input 437 of the NAND gate 435.

The inverting multiplexer 620 has a first input (denoted "0") coupled to the output of the second NOR gate 450, a second input (denoted "1") coupled to the inverse of the input signal $f_{inb}$, and an output coupled to the input d of the first flip-flop 415. A select input (denoted "sel") of the inverting multiplexer 620 receives the divide bit D, as shown in FIG. 6. The inverting multiplexer 620 is configured to select the output signal of the second NOR gate 450 or the inverted input signal $f_{inb}$ based on the logic state of the divide bit D, and couple the inverse of the selected signal to the input d of the first flip-flop 415. For example, the inverting multiplexer 620 may select the output signal of the second NOR gate 450 when the divide bit D is logic zero, and select the inverted input signal $f_{inb}$ when the divide bit D is logic one.

The 1/2/3 divider stage 610 also comprises a clock circuit 640 configured to generate clock signals ckla and clkb to clock the flip-flops 415, 420, 425 and 430, as discussed further below. The clock circuit 640 includes a second NAND gate 645, a second OR gate 650, a fourth inverter 655 and a fifth inverter 660. A first input 642 of the second NAND gate 645 receives the input signal $f_{in}$, and a second input 644 of the second NAND gate 645 receives the inverse of the divide bit D through the fourth inverter 655. The output of the second NAND gate 645 provides clock signal clkb, which is used to clock the first and third flip-flops 415 and 425, as shown in FIG. 6. A first input 652 of the second OR gate 650 receives the input signal $f_{in}$, and a second input 654 of the second OR gate 650 receives the divide bit D. The output of the second NOR gate 650 provides clock signal clka, which is used to clock the second and fourth flip-flops 420 and 430, as shown in FIG. 6. The fifth inverter 660 inverts the input signal $f_{in}$ to provide the inverted input signal $f_{inb}$.

In operation, when the divide bit D is logic zero, the 1/2/3 divider stage 610 functions in a similar manner as the 2/3 divider stage 410 in FIG. 4. The first OR gate 630 couples the input modulus signal $mod_{in}$ to the second input 437 of the first NAND gate 435, and the inverting multiplexer 620 couples the inverse of the output of the second NOR gate 450 to the input d of the first flip-flop 415. In addition, the second OR gate 650 in the clock circuit 640 passes the input signal $f_{in}$ to provide clock signal clka, and the second NAND gate 645 inverts the input signal $f_{in}$ to provide clock signal clkb. Thus, the flip-flops are clocked by complementary clocks clka and clkb, similar to the 2/3 divider stage 410 in FIG. 4.

In this configuration, the 1/2/3 divider stage 610 divides the input signal $f_{in}$ by two or three depending on the logic states of the program bit P and the input modulus signal $mod_{in}$, same as before. More particularly, the 1/2/3 divider stage divides frequency of the input signal $f_{in}$ by three when the program bit P is logic zero and the input modulus signal $mod_{in}$ is logic one, and the divides frequency of the input signal $f_{in}$ by two when the program bit P is logic one.

Figure 7:
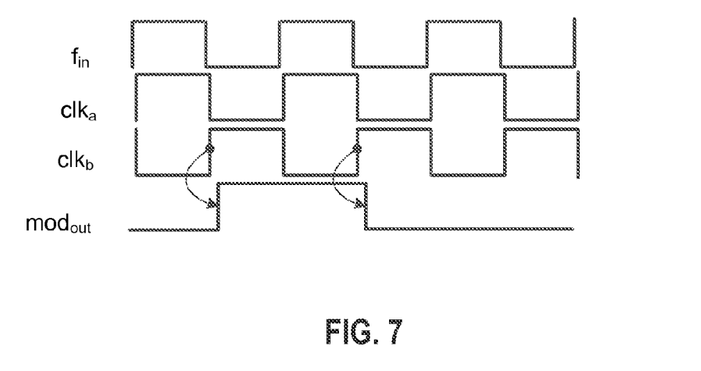
FIG. 7 is a timeline illustrating examples of an input signal and an output modulus signal for the 1/2/3 divider stage in FIG. 6.

Also, the third flip-flip 425 (which is clocked by clkb) retimes the input modulus signal $mod_{in}$ with the clock signal clkb so that a positive edge of the output modulus signal $mod_{out}$ is approximately aligned with a positive edge of the clkb. An example of this is shown in FIG. 7, which shows a timeline of the output modulus signal $mod_{out}$, the input signal $f_{in}$, and clock signals clka and clkb. As shown in FIG. 7, the positive edge of the output modulus signal $mod_{out}$ is approximately aligned with a positive edge of the clock signal clkb. Since the clock signal clkb is the inverse of the input signal fin, the positive (rising) edge of the output modulus signal $mod_{out}$ is approximately aligned with a negative (falling) edge of the input signal $f_{in}$. There is a short delay between the positive edge of the output modulus signal $mod_{out}$ and the negative edge of the input signal $f_{in}$ due to propagation delays in the second NAND gate 645, the third flip-flop 425 and inverter 445. Also, the output modulus signal $mod_{out}$ may be high (logic one) for a duration approximately equal to one cycle (period) of the input signal $f_{in}$, as shown in FIG. 7.

When the divide bit D is logic one, the inverting multiplexer 620 couples the inverse of the inverted input signal $f_{inb}$ to the input d of the first flip-flop 415. In addition, the clock signals clka and clkb are both held high regardless of the logic state of the input signal $f_{in}$. Thus, the clock inputs of the first and second flip-flops 415 and 420 are high, causing the first and second flip-flops 415 and 420 to be transparent. As a result, the input signal fin passes to the output of the divider stage 610 through the first and second flip-flops 415 and 420 and inverters 625 and 455 without frequency division. In this case, $f_{out}$ is the same as $f_{in}$.

It is to be appreciated that the divider stages 310(2) to 310(8) are not limited to the exemplary implementation shown in FIG. 6. For example, when the divide bits is logic zero, the 1/2/3 divider stage may be configured to divide the frequency of the input signal by two when the program bit P is logic zero instead of logic one. In this example, the 2/3 divider stage may divide the frequency by three when the program bit P and the input modulus signal $mod_{in}$ are both logic one.

Figure 8:
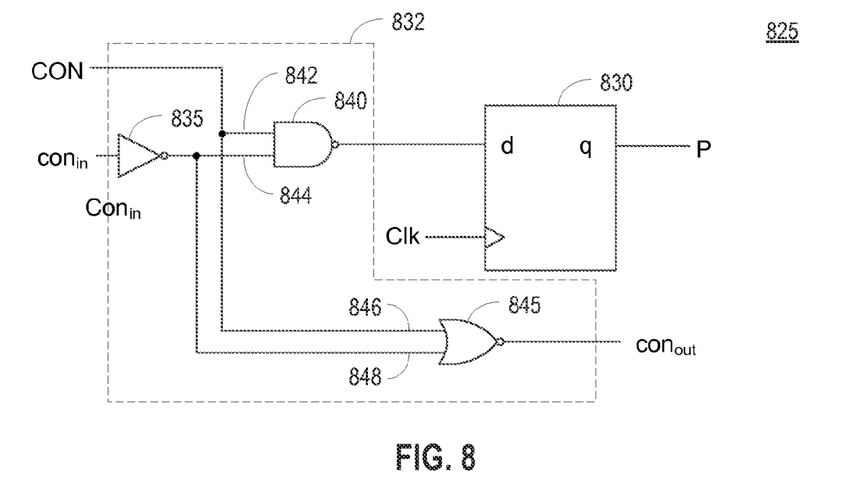
FIG. 8 shows an exemplary load device for a 2/3 divider stage according to certain aspects of the present disclosure.

FIG. 8 shows an exemplary implementation of a load device 825 for a 2/3 divider stage (divider cell) according to certain aspects of the present disclosure. The load device 825 may be used to implement the first load device 325(1) in FIG. 3. The load device 825 comprises a flip-flop 830, and a logic circuit 832 configured to generate the respective program bit. The flip-flop 830 is clocked by the output modulus signal of the respective divider stage. In the example shown in FIG. 8, the logic circuit 832 comprises an inverter 835, a NAND gate 840, and a NOR gate 845. For the example in which the load device 825 is used to implement the first load device 325(1) in FIG. 3, the output modulus signal $mod_{o0}$ of the first divider stage 310(1) is used to clock the flip-flop 830.

A first input 842 of the NAND gate 840 receives the respective control bit CON from the delta-sigma modulator 170, and a second input 844 of the NAND gate 840 receives the inverse of the respective local control input bit $con_{in}$ from the next load device in the load chain through the inverter 835. The output of the NAND gate 840 is coupled to the input of the flip-flop 830. A first input 846 of the NOR gate 845 receives the respective control bit CON from the delta-sigma modulator 170, and a second input 848 of the NOR gate 845 receives the inverse of the respective local control input bit $con_{in}$ from the next load device in the load chain through the inverter 835. The output of the NOR gate 845 provides the local control output bit $con_{out}$ of the load device. For the example in which the load device 825 is used to implement the first load device 325(1) in FIG. 3, the local control output bit may not be used.

In operation, the NAND gate 840 and the inverter 835 generate a program bit P based on the logic states of the control bit CON from the delta-sigma modulator 170 and the local control input bit $con_{in}$ from the next load device in the load chain, and output the generated program bit P to the flip-flop 830. The flip-flop 830 inputs (loads) the generated program bit P to the respective divider stage on an edge of the output modulus signal of the respective divider stage. This is because the flip-flop 830 is clocked by the output modulus signal. The flip-flop 830 may be positive-edge triggered, in which case the flip-flop 830 inputs (loads) the program bit P to the respective divider stage on a rising edge of the output modulus signal.

It is to be appreciated that the load device 825 is not limited to the exemplary implementation shown in FIG. 8. For example, the logic circuit 832 may be implemented using different logic gates and/or a different arrangement of logic gates than shown in the example in FIG. 8.

Figure 9:
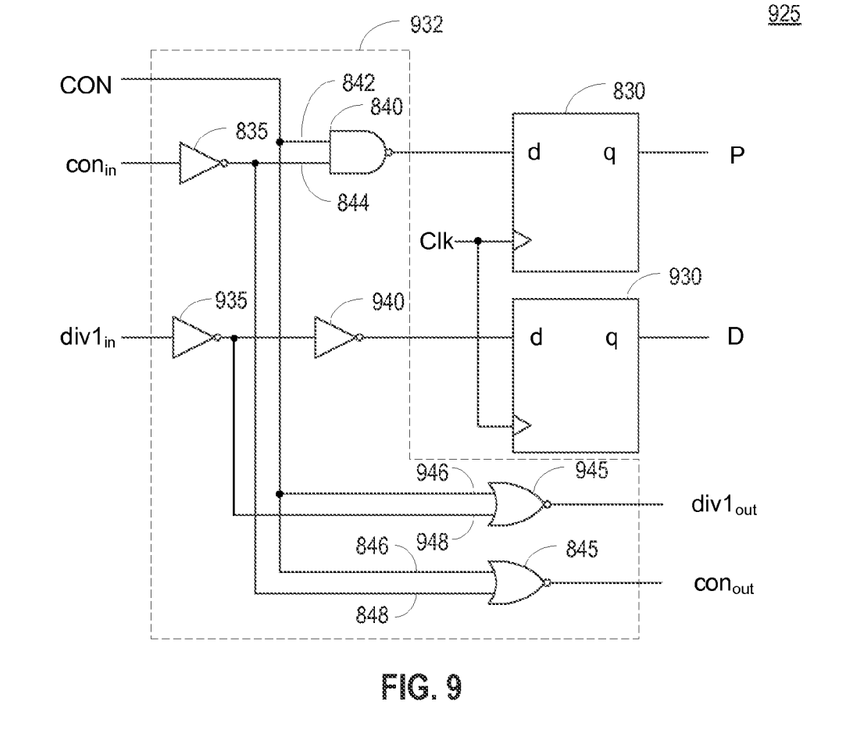
FIG. 9 shows an exemplary load device for a 1/2/3 divider stage according to certain aspects of the present disclosure.

FIG. 9 shows an exemplary implementation of a load device 925 for a 1/2/3 divider stage (divider cell) according to certain aspects of the present disclosure. The load device 925 may be used to implement any of load devices 325(2) to 325(8) in FIG. 3. The load device 925 is similar to the load device 825 in FIG. 8 and includes additional logic in the logic circuit 932 for generating the respective divide bit D and local divide output bit $div1_{out}$. The additional logic comprises a second flip-flop 930, a second inverter 935, a third inverter 940, and a second NOR gate 945. The second flip-flop 930 is clocked by the output modulus signal of the respective divider stage, same as the first flip-flop 830 discussed above. The output q of the second flip-flop 930 provides the divide bit D to the respective divider stage, as discussed further below.

The local divide input bit $div1_{in}$ from the next load device is input to the second flip-flop 930 through the second and third inverters 935 and 940. A first input 946 of the second NOR gate 945 receives the respective control bit CON from the delta-sigma modulator 170, and a second input 948 of the second NOR gate 945 receives the inverse of the respective local divide input bit $div1_{in}$ from the next load device in the load chain through the second inverter 935. The output of the second NOR gate 945 provides the local divide output bit $div1_{out}$ to the previous load device in the load chain.

In operation, the output of the third inverter 940 provides the divide bit D to the input q of the second flip-flop 930. The second flip-flop 930 inputs (loads) the divide bit D to the respective divider stage on an edge of the output modulus signal of the respective divider stage. This is because the second flip-flop 930 is clocked by the output modulus signal. The second flip-flop 930 may be positive-edge triggered, in which case the second flip-flop 930 inputs (loads) the divide bit D to the respective divider stage on a rising edge of the output modulus signal.

It is to be appreciated that the load device 925 is not limited to the exemplary implementation shown in FIG. 9. For example, the logic circuit 932 may be implemented using different logic gates and/or a different arrangement of logic gates than shown in the example in FIG. 9.

Figure 10:
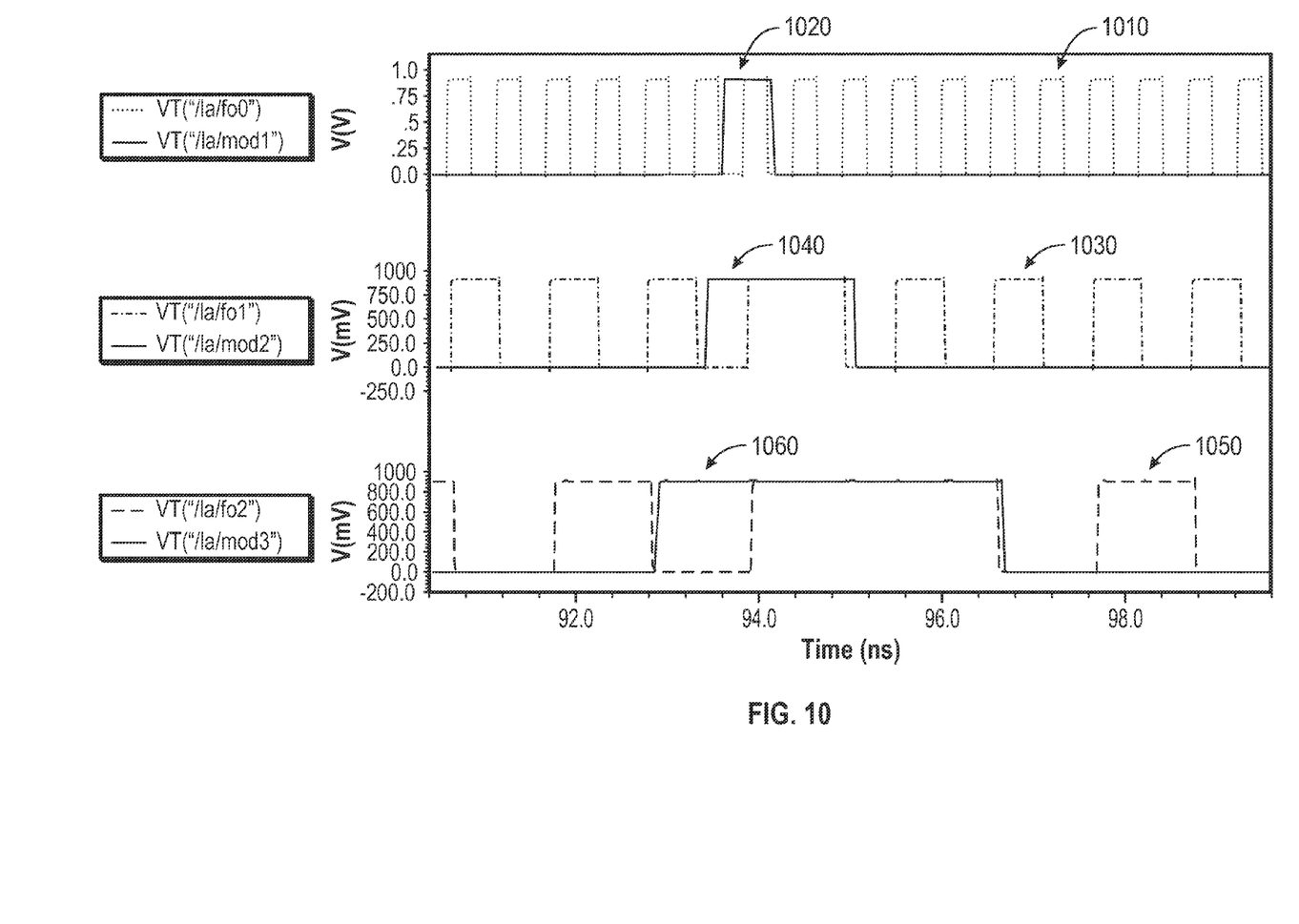
FIG. 10 is a timeline illustrating exemplary input signals and output modulus signals for three divider stages according to certain aspects of the present disclosure.

FIG. 10 shows an example of the input signal $f_{o0}$ 1010 to the second divider stage 310(2) and the output modulus signal $mod_{o1}$ 1020 of the second divider stage 310(2) over time. As shown in FIG. 10, the rising edge of the output modulus signal $mod_{o1}$ 1020 occurs shortly after a falling edge of the input signal $f_{o0}$ 1010, and therefore occurs at a time when the input signal $f_{o0}$ 1010 is low. Since the program bit P<1> and divide bit D<1> of the second divider stage 310(2) are input (loaded) to the second divider stage 310(2) on the rising edge of the output modulus signal $mod_{o1}$ 1020, the divider value of the second divider stage 310(2) is updated when the input signal $f_{o0}$ 1010 to the second divider stage 310(2) is low. This prevents glitch when the divider value of the second divider stage 310(2) is updated.

FIG. 10 also shows an example of the input signal $f_{o1}$ 1030 to the third divider stage 310(3) and the output modulus signal $mod_{o2}$ 1040 of the third divider stage 310(3) over time. As shown in FIG. 10, the rising edge of output modulus signal $mod_{o2}$ 1040 occurs when the input signal $f_{o1}$ 1030 is low. Thus, the divider value for the third divider stage 310(3) is updated when the input signal $f_{o1}$ 1030 to the third divider stage 310(3) is low. FIG. 10 further shows an example of the input signal $f_{o2}$ 1050 to the fourth divider stage 310(4) and the output modulus signal $mod_{o3}$ 1060 of the fourth stage 310(4) over time. As shown in FIG. 10, the rising edge of output modulus signal $mod_{o3}$ 1060 occurs when the input signal $f_{o2}$ 1050 is low. Thus, the divider value for the fourth divider stage 310(4) is updated when the input signal $f_{o2}$ 1060 to the fourth divider stage 310(4) is low. In general, using the modulus output signal of a divider stage as a local load signal for updating the divider value of the divider stage helps ensure that the divider value of the divider stage changes when the respective input signal is low, thereby avoiding glitch.

Figure 11:
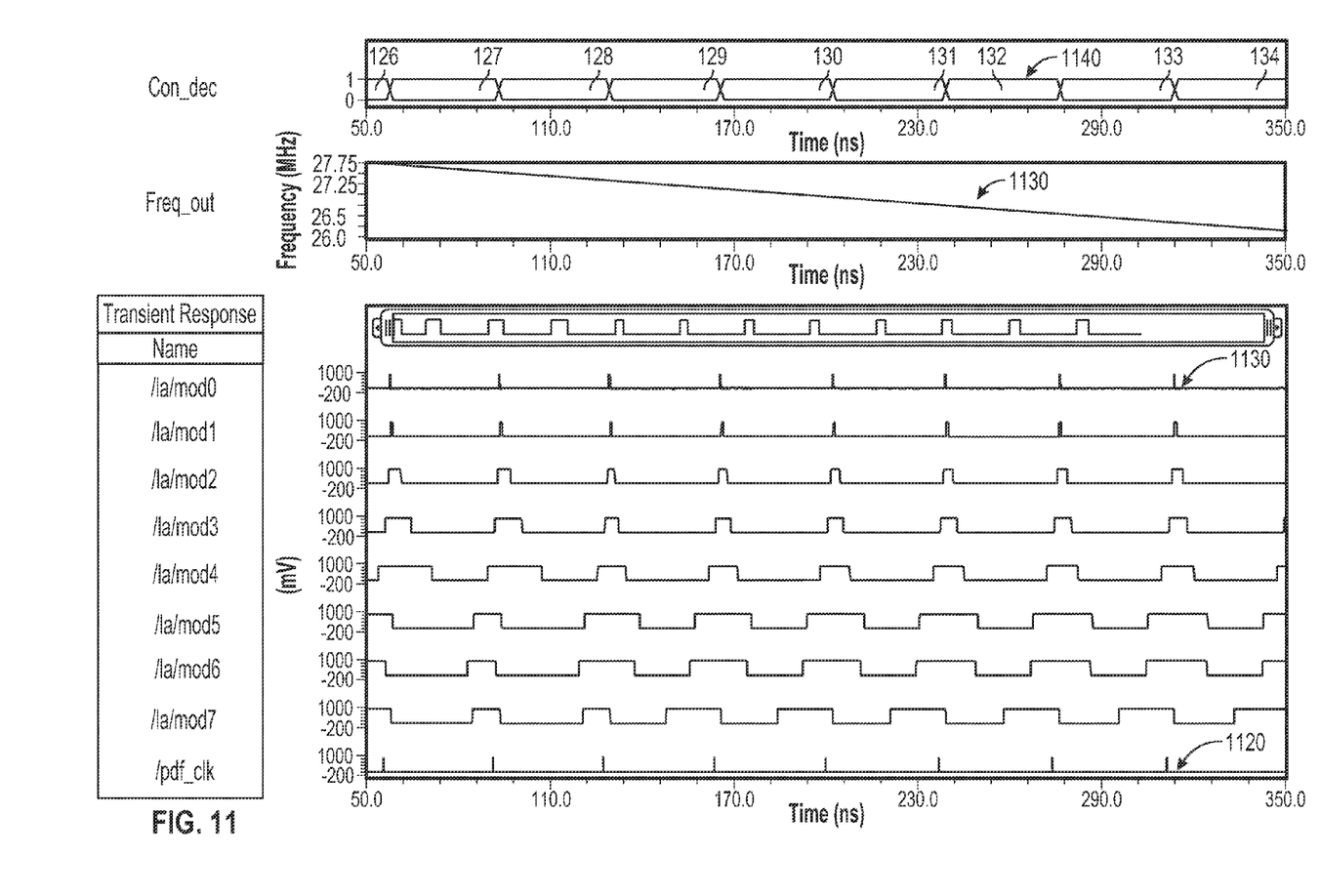
FIG. 11 is a timeline illustrating exemplary output modulus signals for a plurality of divider stages according to certain aspects of the present disclosure.

FIG. 11 shows exemplary output modulus signals of the divider stages 310(1) to 310(8) over time. In this example, the divider value 1140 of the divider 360 is incrementally increased, causing the output frequency 1130 to decrease over time, as shown in FIG. 11. The output modulus signal 1110 of the first divider stage 310(1) ($mod_{o0}$ in FIG. 3) comprises one pulse per period of the divider output (e.g., period of the input signal from the VCO multiplied the divisor of the divider 360). The output modulus signal 1110 is re-clocked (retimed) with the VCO signal by the output latch 315 to generate the output signal 1120 of the divider 360 (Pfd_Clk in FIG. 3). More particularly, each pulse of the output modulus signal 1110 is aligned with an edge (e.g., rising edge) of the VCO signal by the output latch 315. As a result, the output signal 1120 is approximately synchronous with the VCO signal. Retiming the output modulus signal 1110 with the VCO reduces jitter in the output modulus signal 1110 that accumulates as the modulus signal propagates up the divider chain.

Figure 12:
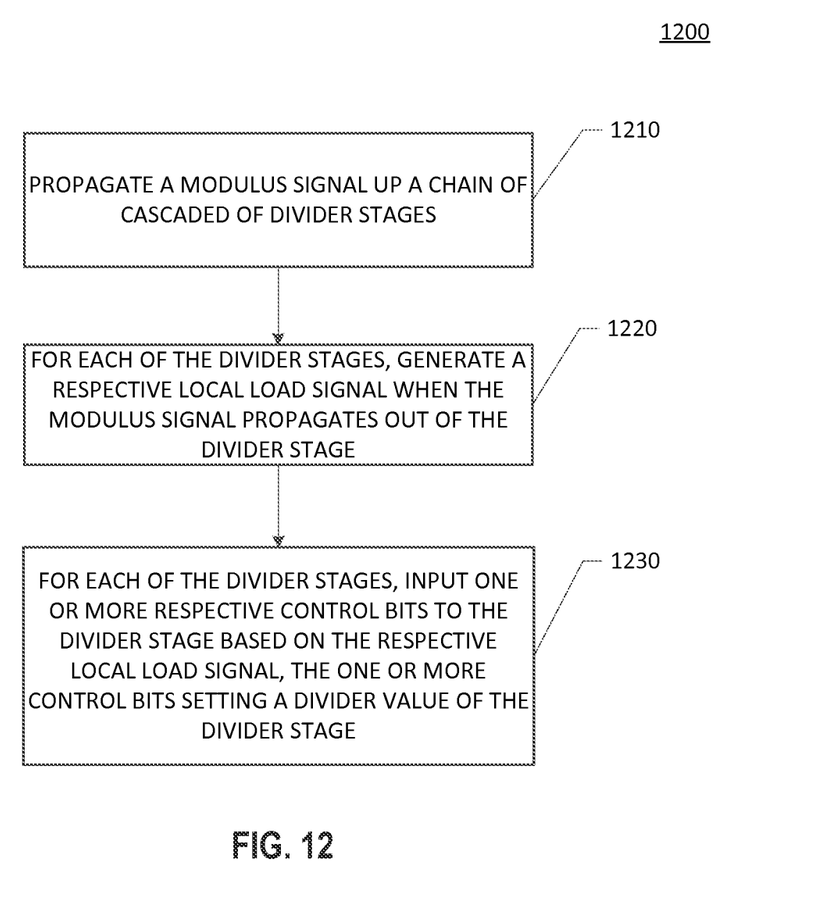
FIG. 12 is a flowchart showing a method for frequency division according to an embodiment of the present disclosure.

FIG. 12 is a flowchart illustrating a method 1200 for frequency division according to an embodiment of the present disclosure. The method 1200 may be performed by the multi-modulus frequency divider 360.

At step 1210, a modulus signal propagates up a chain of cascaded divider stages from a last one of the divider stages to a first one of the divider stages. For example, the modulus signal may originate at a last one of the divider stages (e.g., divider stage 310(8)) and propagate up the chain of cascaded divider stages (e.g., divider stages 310(1) to 310(8)).

At step 1220, for each of the divider stages, a respective local load signal is generated when the modulus signal propagates out of the divider stage. For example, the local load signal for each divider stage may be provided by the modulus output of the divider stage.

At step 1230, for each of the divider stages, one or more respective control bits are input to the divider stage based on the respective local load signal, the one or more respective control bits setting a divider value of the divider stage. For example, the one or more control bits for each divider stage may be input to the divider stage on a rising edge of the local load signal (e.g., modulus output of the divider stage).

Those skilled in the art will appreciate that the various illustrative blocks, and steps described in connection with the disclosure herein may be implemented as electronic hardware, computer software, or combinations of both. To clearly illustrate this interchangeability of hardware and software, various illustrative components, blocks, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative blocks described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A frequency divider, comprising:
   a plurality of cascaded divider stages forming a divider chain, wherein each of the divider stages is configured to receive one or more respective control bits and to set a divider value of the divider stage based on the one or more respective control bits, and wherein the plurality of cascaded divider stages is configured to propagate an input signal down the divider chain from a first one of the divider stages to a last one of the divider stages, to divide a frequency of the input signal, and to propagate a modulus signal up the divider chain from the last one of the divider stages to the first one of the divider stages, and each of the divider stages is configured to output a respective local load signal when the modulus signal propagates out of the divider stage; and
   an extension device coupled to the plurality of divider stages, wherein, for each of the divider stages, the extension device is configured to receive the respective local load signal from the divider stage and to input the one or more respective control bits for the divider stage to the divider stage based on the respective local load signal.

2. The frequency divider of claim 1, wherein, for each of the divider stages, the extension device is configured to input the one or more respective control bits for the divider stage to the divider stage on an edge of the respective local load signal.

3. The frequency divider of claim 2, wherein the edge of the respective local load signal is a rising edge of the respective local load signal.

4. The frequency divider of claim 1, wherein the extension device comprises a plurality of load devices, each of the load devices corresponds to a respective one of the divider stages, and each of the load devices comprises:
   a logic circuit configured to generate the one or more respective control bits for the respective divider stage; and
   a flip-flop configured to receive the one or more respective control bits from the respective logic circuit, to receive the respective local load signal from the respective divider stage, and to output the one or more respective control bits to the respective divider stage on an edge of the respective local load signal.

5. The frequency divider of claim 4, wherein the edge of the respective local load signal is a rising edge of the respective local load signal.

6. The frequency divider of claim 1, wherein the extension device is configured to receive a plurality of control bits from a delta-sigma modulator and to convert the plurality of control bits into the respective control bits for the divider stages.

7. The frequency divider of claim 1, wherein at least one of the divider stages is a 1/2/3 divider stage, and the respective one or more control bits comprises a respective program bit and a respective divide bit.

8. The frequency divider of claim 7, wherein the 1/2/3 divider stage is configured to set the respective divider value to one if the respective divide bit has a first logic state, and to set the respective divider value to two or three depending at least in part on a logic state of the respective program bit if the divide bit has a second logic state.

9. The frequency divider of claim 1, further comprising an output latch configured to receive the modulus signal from a modulus output of one of the divider stages, to receive the input signal, and to retime the received modulus signal with the received input signal to generate an output signal of the frequency divider.

10. The frequency divider of claim 9, wherein the output latch is configured to align an edge of the received modulus signal with an edge of the received input signal.

11. A frequency divider, comprising:
   a plurality of cascaded divider stages forming a divider chain, wherein the plurality of cascaded divider stages is configured to receive a plurality of control bits that set a divisor of the plurality of cascaded divider stages, to propagate an input signal down the divider chain from a first one of the divider stages, to a last one of the divider stages, to divide a frequency of the input signal by the divisor, and to propagate a modulus signal up the divider chain from the last one of the divider stages to the first one of the divider stages; and
   an output latch configured to receive the modulus signal from a modulus output of one of the divider stages, to receive the input signal, and to retime the received modulus signal with the received input signal to generate an output signal of the frequency divider.

12. The frequency divider of claim 11, wherein the output latch is configured to align an edge of the received modulus signal with an edge of the received input signal.

13. The frequency divider of claim 12, wherein the received modulus signal comprises a single pulse during a divider period, the divider period being approximately equal to a period of the input signal multiplied by the divisor of the plurality of cascaded divider stages.

14. The frequency divider of claim 11, wherein each of the divider stages is configured to retime the modulus signal at the divider stage with an edge of the input signal received at a respective frequency input of the divider stage.

15. A method for frequency division, comprising:
propagating an input signal down a chain of cascaded divider stages from a first one of the divider stages to a last one of the divider stages, wherein the chain of cascaded divider stages divides a frequency of the input signal;
propagating a modulus signal up the chain of cascaded divider stages from the last one of the divider stages to the first one of the divider stages;
for each of the divider stages, generating a respective local load signal when the modulus signal propagates out of the divider stage; and
for each of the divider stages, inputting one or more respective control bits to the divider stage based on the respective local load signal, the one or more respective control bits setting a divider value of the divider stage.

16. The method of claim 15, wherein, inputting the one or more respective control bits for each of the divider stages comprises inputting the one or more respective control bits on an edge of the respective local load signal.

17. The method of claim 16, wherein the edge of the respective local load signal is a rising edge of the respective local load signal.

18. The method of claim 15, further comprising:
receiving the modulus signal from a modulus output of one of the divider stages;
receiving the input signal; and
retiming the received modulus signal with the received input signal to generate an output signal.

19. The method of claim 18, retiming the received modulus signal comprises aligning an edge of the received modulus signal with an edge of the received input signal.

20. An apparatus for frequency division, comprising:
means for propagating an input signal down a chain of cascaded divider stages from a first one of the divider stages to a last one of the divider stages, wherein the chain of cascaded divider stages divides a frequency of the input signal;
means for propagating a modulus signal up the chain of cascaded divider stages from the last one of the divider stages to the first one of the divider stages;
for each of the divider stages, means for generating a respective local load signal when the modulus signal propagates out of the divider stage; and
for each of the divider stages, means for inputting one or more respective control bits to the divider stage based on the respective local load signal, the one or more respective control bits setting a divider value of the divider stage.

21. The apparatus of claim 20, wherein, the means for inputting the one or more respective control bits for each of the divider stages comprises means for inputting the one or more respective control bits on an edge of the respective local load signal.

22. The apparatus of claim 21, wherein the edge of the respective local load signal is a rising edge of the respective local load signal.

23. The apparatus of claim 20, further comprising:
means for receiving the modulus signal from a modulus output of one of the divider stages;
means for receiving the input signal; and
means for retiming the received modulus signal with the received input signal to generate an output signal.

24. The apparatus of claim 23, the means for retiming the received modulus signal comprises means for aligning an edge of the received modulus signal with an edge of the received input signal.

* * * * *